United States Patent
Tokumoto (10) Patent No.: US 12,227,110 B2
(45) Date of Patent: Feb. 18, 2025

(54) TRACK-GUIDED CART SYSTEM

(71) Applicant: MURATA MACHINERY, LTD., Kyoto (JP)

(72) Inventor: Mitsuya Tokumoto, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 121 days.

(21) Appl. No.: 17/921,422

(22) PCT Filed: Mar. 11, 2021

(86) PCT No.: PCT/JP2021/009866
§ 371 (c)(1),
(2) Date: Oct. 26, 2022

(87) PCT Pub. No.: WO2021/220636
PCT Pub. Date: Nov. 4, 2021

(65) Prior Publication Data
US 2023/0182577 A1    Jun. 15, 2023

(30) Foreign Application Priority Data
May 1, 2020  (JP) .................................. 2020-081444

(51) Int. Cl.
*B60L 7/22*     (2006.01)
*B60L 50/60*    (2019.01)
*H01L 21/677*   (2006.01)

(52) U.S. Cl.
CPC ................. *B60L 7/22* (2013.01); *B60L 50/60* (2019.02); *H01L 21/6773* (2013.01); *H01L 21/67733* (2013.01)

(58) Field of Classification Search
CPC ... B60L 50/60; B60L 7/22; B60L 7/10; H01L 21/67733; H01L 21/67727; H01L 21/6773; B60T 1/10; F16D 61/00
See application file for complete search history.

(56) References Cited

FOREIGN PATENT DOCUMENTS

| CN | 110481571 A | * 11/2019 | ................ B60L 7/10 |
|---|---|---|---|
| EP | 1 152 075 A1 | 11/2001 | |
| EP | 3476685 A1 | 5/2019 | |
| JP | 08-20332 A | 1/1996 | |
| JP | 2002-037429 A | 2/2002 | |
| JP | 2004-135405 A | 4/2004 | |
| JP | 2006-261145 A | 9/2006 | |
| NL | 8400382 A | 9/1985 | |

OTHER PUBLICATIONS

Official Communication issued in International Patent Application No. PCT/JP2021/009866, mailed on Nov. 10, 2022.
(Continued)

*Primary Examiner* — Said Bouziane
(74) *Attorney, Agent, or Firm* — Keating & Bennett, LLP (57) ABSTRACT

A rail-guided vehicle system connecting between vertically-spaced floors includes a descending rail to enable a travel vehicle to move downward. The descending rail has a helical structure and includes a rail in a first section where energy is generated when a brake included in the travel vehicle works and a rail in a second section where energy that has been generated when a travel vehicle traveled in the first section is consumed.

12 Claims, 6 Drawing Sheets

(56) References Cited

OTHER PUBLICATIONS

English translation of Official Communication issued in International Patent Application No. PCT/JP2021/009866, mailed on May 25, 2021.
Official Communication issued in corresponding European Patent Application No. 21796467.5, mailed on Apr. 29, 2024.
Official Communication issued in International Patent Application No. PCT/JP2021/009866, mailed on May 25, 2021.

* cited by examiner

TRACK-GUIDED CART SYSTEM

BACKGROUND OF THE INVENTION

1. Field of the Invention

An aspect of the present invention relates to a rail-guided vehicle system.

2. Description of the Related Art

A known system transports, for example, a container such as a FOUP (Front Opening Unified Pod) to accommodate a plurality of semiconductor wafers, a container to store glass substrates, a container such as a reticle pod and an article such as general parts, using a travel vehicle capable of moving along a traveling rail. For example, Japanese Unexamined Patent Application Publication No. 2006-261145 discloses a rail-guided vehicle system that uses a lift having an elevating function in order to transport an article between rails laid on each of a plurality of floors in a height direction.

SUMMARY OF THE INVENTION

However, the conventional rail-guided vehicle system including a lift having an elevating function has issues, for example, a large burden of maintenance work for lift or a traffic jam of travel vehicles at an upstream side of the lift. Therefore, it is considered provide a rail to connect directly between floors having a difference in height. However, such a rail needs to have a gradient, and brakes for a travel vehicle descending the gradient need to work properly.

Preferred embodiments of the present invention provide rail-guided vehicle systems that each enable brakes for a travel vehicle to work properly in a descending rail that connects between floors with a difference in height.

A rail-guided vehicle system according to an aspect of a preferred embodiment of the present invention connects between vertically-spaced floors and includes a descending rail to enable a travel vehicle to move downward. The descending rail includes a helical structure and a first rail in a first section where heat energy or electric energy converted from kinetic energy by actuation of brakes included in the travel vehicle is generated, and a second rail in a second section where the heat energy generated in the first section is released or where the electric energy generated in the first section is consumed.

The "heat energy is released" includes a state in which released heat energy is larger than supplied heat energy. Further, the "electric energy is consumed" includes a state in which consumed electric energy is larger than supplied electric energy.

In the rail-guided vehicle system with this configuration, the descending rail has a helical structure so that a gradient of the descending rail can be adjusted to be appropriate for the travel vehicle to travel thereon (to be able to control the speed of the travel vehicle) and the descending rail is able to be provided in a compact flat space. The descending rail includes not only the first rail in the first section where heat energy or electric energy converted from kinetic energy when the brakes work is generated, but also the second rail in the second section where the heat energy generated in the first section is released or where the electric energy generated in the first section is consumed. As a result, the heat energy or the electric energy that has been generated in the first section can be released or consumed in the second section, respectively, thus enabling a prevention of defects of the brakes due to overcharge or heat generation. As a result, in the descending rail connecting between the vertically-spaced floors, the brakes for the traveling vehicle can work properly.

In an aspect of a preferred embodiment of the present invention, the travel vehicle includes regenerative brakes, and a battery to store the electric energy generated in the regenerative brakes or a resistor to convert the electric energy generated in the regenerative brakes into the heat energy. The first section may convert the electric energy into the heat energy in the resistor or may store the electric energy in the battery, and the second section may release the heat energy converted in the resistor or may consume the electric energy stored in the battery.

In the rail-guided vehicle system with this configuration, the descending rail includes not only the first rail in the first section where heat energy or electric energy converted from kinetic energy is generated when the regenerative brakes work, but also includes the second rail in the second section where the heat energy generated in the first section is released or where the electric energy generated in the first section is consumed. As a result, the heat energy or the electric energy that has been generated in the first section can be released or consumed in the second section, respectively, thus enabling prevention of defects of the regenerative brakes caused by invalidation of regeneration or damage due to, for example, an excessive heat generation in the resistor, or enabling prevention of defects of the regenerative brakes caused by invalidation of regeneration a or decrease in longevity of the battery due to, for example, overcharging of the battery. As a result, in the descending rail connecting between the vertically-spaced floors, the regenerative brakes for the traveling vehicle can work properly.

In a rail-guided vehicle system according to an aspect of a preferred embodiment of the present invention, the second rail may extend in a horizontal direction. With this configuration, the second section can have a simplified configuration. The second section is where heat energy or electric energy that has been generated when a travel vehicle traveled in the first section is released or consumed, respectively. In addition, in such a horizontal section, a travel vehicle can place an article on a placement section from various directions.

In a rail-guided vehicle system according to an aspect of a preferred embodiment of the present invention, the second section may include a branching portion and/or a joining portion. With this configuration, a downward movement to a plurality of floors can be easily performed.

In a rail-guided vehicle system according to an aspect of a preferred embodiment of the present invention, a descending gradient of the first rail may be steeper than a descending gradient of the second rail. The second section being compared to the first section may extend in a horizontal direction, that is, a gradient of the second section may be zero. With this configuration, the second section can have a simplified configuration. The second section is where energy that has been generated when a travel vehicle traveled in the first section is consumed.

In a rail-guided vehicle system according to an aspect of a preferred embodiment of the present invention, the descending rail may include rails defining straight sections parallel or substantially parallel to each other in a plan view as seen from above in a vertical direction. The descending rail also may include a rail defining a curved section at end portions of the rails defining the straight sections. With this configuration, an ascending rail can be installed easily in a narrow and long space between buildings.

A rail-guided vehicle system according to an aspect of a preferred embodiment of the present invention further may include an ascending rail that connects between the vertically-spaced floors and on which the travel vehicle moves upward. The ascending rail may overlap with the descending rail in a plan view as seen from above in a vertical direction. With this configuration, an ascending rail and a descending rail can be installed integrally in a narrow and long space between buildings.

In a rail-guided vehicle system according to an aspect of a preferred embodiment of the present invention, the descending rail and the ascending rail may include a helical section extending radially from a helical center of the descending rail. With this configuration, the vertical spacing between the descending rail and the ascending rail can be increased by adjusting lengths of the descending rail and the ascending rail.

In a rail-guided vehicle system according to an aspect of a preferred embodiment of the present invention, a step for a worker to do maintenance work may be provided in an area surrounded by the descending rail. With this configuration, a space can be effectively used and maintenance work in the descending rail can be performed easily.

According to an aspect of a preferred embodiment of the present invention, brakes for a travel vehicle can work properly in the descending rail connecting between the vertically-spaced floors.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of aspects of the present invention will be described in detail with reference to the drawings. In the description of the drawings, the same elements will be denoted by the same reference symbols, without redundant description.

Figure 1:
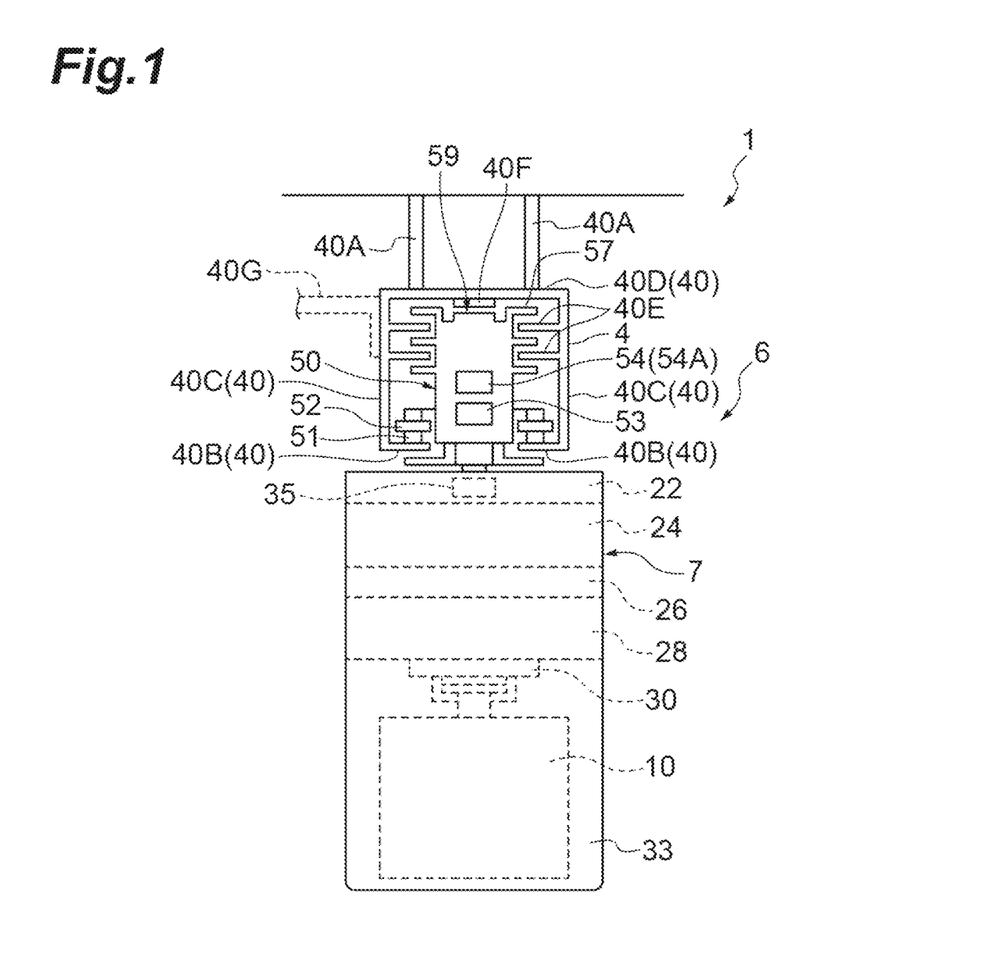
FIG. 1 is a front schematic diagram of a travel vehicle used for a rail-guided vehicle system according to a preferred embodiment of the present invention seen from a traveling direction.

As illustrated in FIG. 1, a rail-guided vehicle system 1 is a system to transport an article 10 between placement sections 9, 9 (see FIG. 2) using a travel vehicle 6 capable of moving along a traveling rail (rail) 4. The article 10 includes a FOUP (Front Opening Unified Pod) to accommodate a plurality of semiconductor wafers, a container to store glass substrates, a container such as a reticle pod, and general parts. The rail-guided vehicle system 1 is provided with a plurality of travel vehicles 6, the traveling rail 4 and a plurality of placement sections 9.

The travel vehicle 6 travels on the traveling rail 4 to transport an article 10. The travel vehicle 6 is configured to be capable of transferring an article 10. The travel vehicle 6 is an overhead hoist transport. The number of the travel vehicles 6 included in the rail-guided vehicle system 1 is not specifically limited and is more than one. The travel vehicle 6 includes a body unit 7, a travel unit 50, and a control unit 35. The body unit 7 has a body frame 22, a lateral moving unit 24, a θ drive 26, an elevating drive unit 28, an elevating platform 30, and a cover 33.

The body frame 22 is connected with the travel unit 50 to support the lateral moving unit 24, the θ drive 26, the elevating drive unit 28, the elevating platform 30, and the cover 33. The lateral moving unit 24 laterally slides the θ drive 26, the elevating drive unit 28, and the elevating platform 30 all together in a direction orthogonal to a traveling direction of the traveling rail 4. The θ drive 26 rotates at least any of the elevating drive unit 28 and the elevating platform 30 within a predetermined angle range in a horizontal plane. The elevating drive unit 28 elevates and lowers the elevating platform 30 by reeling and unreeling a suspender such as a rope and a belt. A chuck is attached to the elevating platform 30 to grip or release an article 10 freely. A pair of the covers 33 are provided, for example, at front and rear of a traveling direction of the travel vehicle 6. Claws or the like (not illustrated) that come out from the cover 33 prevent an article 10 from dropping during transport.

The travel unit 50 causes the travel vehicle 6 to travel along the traveling rail 4. The travel unit 50 includes travel rollers 51, side rollers 52, regenerative brakes (brakes) 53, a resistor 54, feed cores 57 and LDMs (Linear DC Motor) 59.

The travel rollers 51 roll on lower surface portions 40B of the traveling rail 4. The travel rollers 51 are arranged at both left-right ends of front and rear of the travel unit 50. The side rollers 52 are provided to be able to come in contact with side surface portions 40C of the traveling rail 4. The regenerative brake 53 is a device to brake the travel vehicle 6 by converting kinetic energy into electric energy, and, for example, includes the control unit 35 that controls LDM59 and a driver (not illustrated). The resistor 54 converts electric energy that has been generated by the regenerative brakes 53 into heat energy and releases it into atmosphere.

The feed cores 57 are arranged at front and rear of the travel unit 50 with the LDM59 interposed in a left/right direction. Each feed core 57 supplies a feed unit 40E arranged at the traveling rail 4 with power in a non-contact manner and sends/receives various signals from/to the feed unit 40E in a non-contact manner. The feed core 57 sends/receives signals to/from the control unit 35. The LDMs 59 are provided at front and rear of the travel unit 50. Magnetic force to accelerate or brake the travel vehicle 6 is generated between an electromagnet provided at the LDM 59 and a magnetic plate 40F arranged on top surface of the traveling rail 4.

The traveling rail 4 is a predetermined travel path on which the travel vehicle 6 travels. The traveling rail 4 includes a cylindrical rail body unit 40, the feed unit 40E and the magnetic plate 40F. The rail body unit 40 includes a pair of lower surface portions 40B, 40B, a pair of side surface portions 40C, 40C, and a top portion 40D. The rail body unit 40 accommodates (includes) the travel unit 50 of the travel vehicle 6. The lower surface portion 40B extends in a traveling direction of the travel vehicle 6 to define a bottom surface of the rail body unit 40. The lower surface portion 40B is a plate-shaped member on which the travel roller 51 of the travel vehicle 6 rolls and travels. The side surface portion 40C extends in a traveling direction of the travel vehicle 6 to define a side surface of the rail body unit 40. The side surface portion 40C is a plate shaped member on which the side roller 52 of the travel vehicle 6 rolls. The top surface portion 40D extends in a traveling direction of the travel vehicle 6 to define a top surface of the rail body unit 40.

The feed unit 40E supplies power to the feed core 57 of the travel vehicle 6 and sends/receives signals to/from the feed core 57. The feed unit 40E is fixed to each of the pair of side surface portions 40C, 40C and extends in a traveling direction. The feed unit 40E supplies power to the feed core 57 in a non-contact manner. The magnetic plate 40F generates magnetic force in the LCM 59 of the travel vehicle 6 to travel or stop. The magnetic plate 40F is fixed to the top surface portion 40D and extends in a traveling direction.

Figure 2:
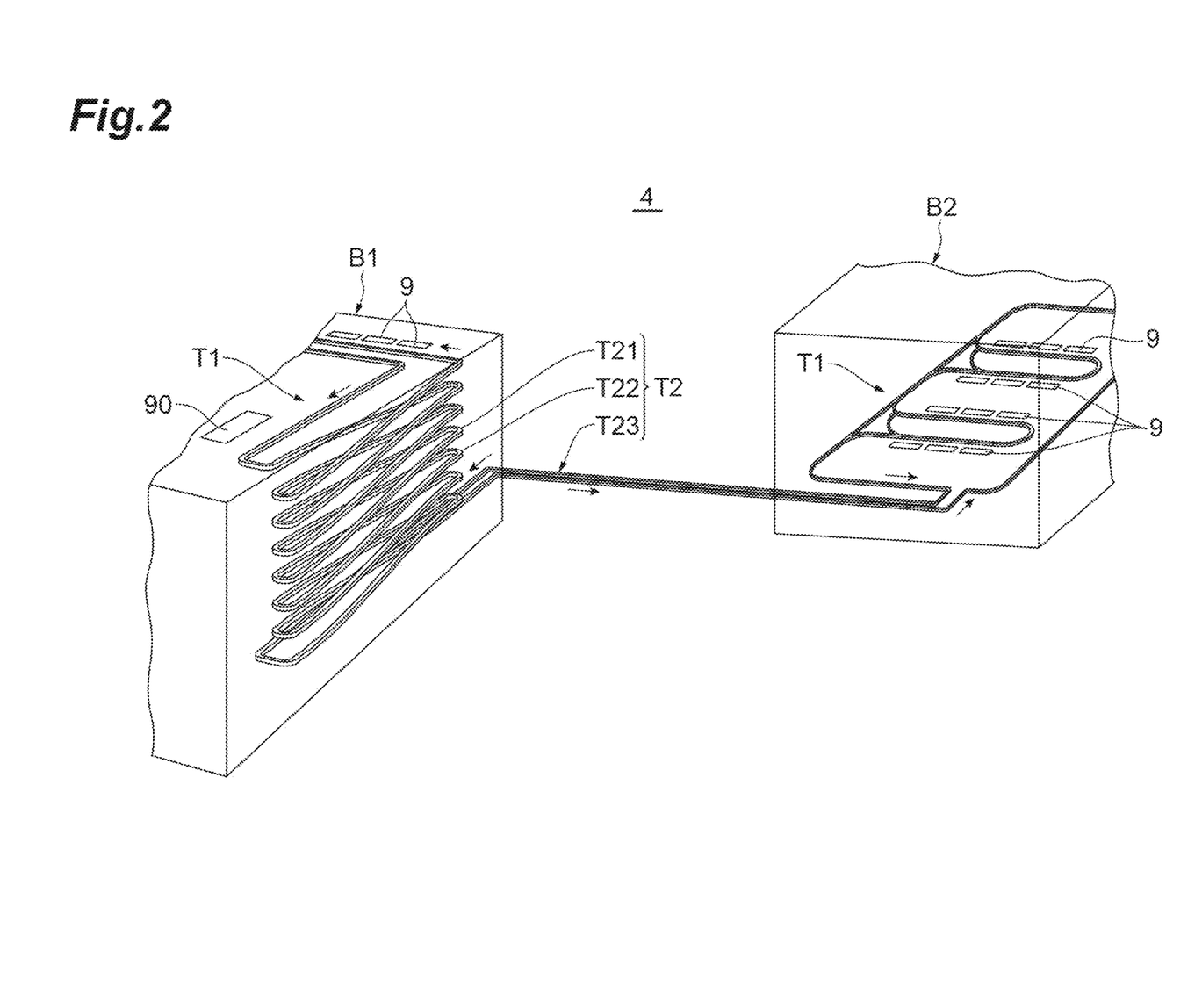
FIG. 2 is a schematic layout in a case where a rail-guided vehicle system is applied to a transport between buildings.

As illustrated in FIG. 2, the traveling rail 4 includes an in-building transport unit T1 arranged at each floor of buildings (a first building B1 and a second building B2) and a transport unit between buildings T2 connecting between the first building B1 and the second building B2. In the in-building transport unit T1, the traveling rail 4 is laid, for example, near a ceiling in a space above a head of a worker. The traveling rail 4 is suspended and supported, for example, from the ceiling of the building by masts 40A, 40A (See FIG. 1).

The transport unit between buildings T2 includes a descending rail T21, an ascending rail 22, and a connection rail T23. The descending rail T21 connects between floors having a difference in height in a vertical direction. Also, the descending rail T21 is laid for the travel vehicle 6 to move downward. The ascending rail T22 connects between floors having a difference in height in a vertical direction. Also, the ascending rail T22 is laid for the travel vehicle 6 to move upward. The descending rail T21 and the ascending rail T22 connect between the bottommost position where the connection rail T23 is placed and the topmost position which is the top floor of the first building B1. The connection rail T23 connects locations having no difference in height in a vertical direction. Also, the connection rail T23 is laid for the travel vehicle 6 to move horizontally.

Figure 3:
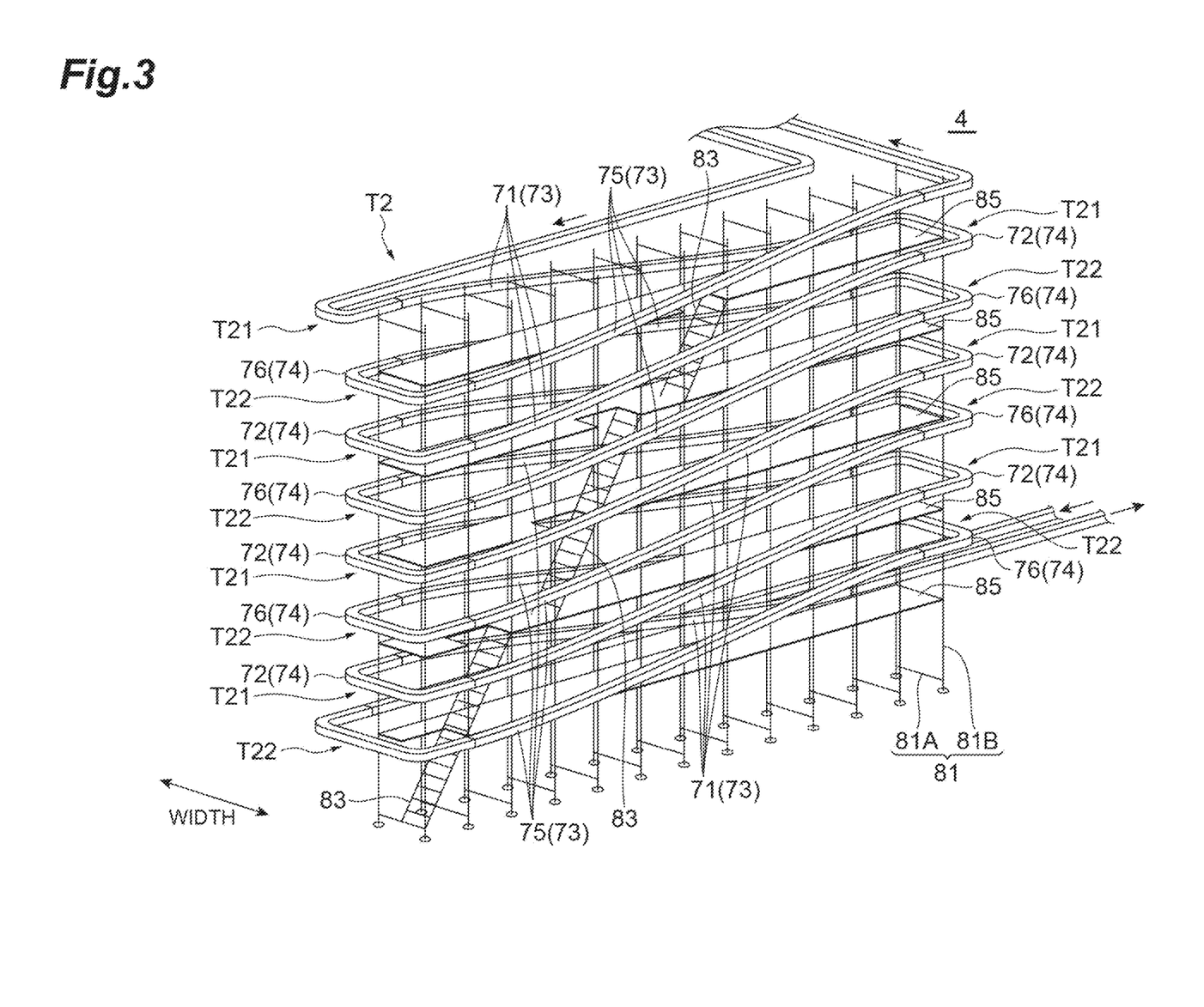
FIG. 3 is a perspective view illustrating a descending rail and an ascending rail in a rail-guided vehicle system.

As illustrated in FIG. 3, the descending rail T21 is arranged in a helical manner. As illustrated in FIG. 1 and FIG. 3, the descending rail T21 includes a traveling rail 4 which defines a first section 71 where electric energy, which is generated when a regenerative brake 53 included in the travel vehicle 6 works, is converted into heat energy in a resistor 54. The descending rail T21 also includes a traveling rail 4 which defines a second section 72 where the heat energy converted in the first section 71 is released from the resistor 54.

A descending gradient of the traveling rail 4 in the first section 71 is larger than a descending gradient of the traveling rail 4 in the second section 72. In the present preferred embodiment, the traveling rail 4 in the second section 72 extends in a horizontal direction. Further, the descending rail T21 includes traveling rails 4 which define straight sections 73 arranged so as to be parallel or substantially parallel to each other in a plan view seen from above in a vertical direction. The descending rail T21 also includes a traveling rail 4 which defines a curved section 74 provided at end portions of the traveling rails 4 defining the straight sections 73.

The ascending rail T22 is arranged in a helical manner and includes a traveling rail 4 which defines a third section 75 which is an ascending gradient, and a traveling rail 4 which defines a fourth section 76 extending in a horizontal direction. In addition, the ascending rail T22 includes the traveling rails 4 which define straight sections 73 arranged so as to be parallel or substantially parallel to each other in a plan view seen from above in a vertical direction. The ascending rail T22 also includes a traveling rail 4 which defines the curved section 74 provided at end portions of the traveling rails 4 defining the straight sections 73. The ascending rail T22 is arranged so as to overlap with the descending rail T21 in a plan view seen from above in a vertical direction.

The descending rail T21 and the ascending rail T22 are supported by a frame 81. The frame 81 includes a lateral frame 81A and a longitudinal frame 81B. The descending rail T21 and the ascending rail T22 are supported, for example, by the frames 81 via a support member 40G (see FIG. 1). The frame 81 is provided in an area surrounded by the descending rail T21 and the ascending rail T22 arranged in a helical manner. A plurality of steps (stepstools) 85 for a worker to do maintenance work for the travel vehicle 6 or the traveling rail 4 are arranged in the frame 81 at a predetermined space in a vertical direction. That is, the steps 85 are arranged in an area surrounded by the descending rail T21 and the ascending rail T22 arranged in a helical manner. A ladder 83 is provided between the ground and the bottommost step 85 and between the steps 85, 85 adjacent to each other for a worker to move up and down.

As illustrated in FIG. 2, the placement sections 9 are arranged along the traveling rail 4 and provided at positions that enable an article 10 to be delivered from/to the travel vehicle 6. A buffer and a delivery port are included in each placement section 9. The buffer is a placement part on which an article 10 is temporarily placed. The buffer is a placement part where an article 10 is temporarily placed when the article 10 being transported by the travel vehicle 6 cannot be transferred to a targeted delivery port, for example, for the reason that the targeted delivery port is occupied by another article 10. The delivery port is a placement part for delivering an article 10 from/to a semiconductor processing device (not illustrated), for example, a washing device, a deposition system, a lithography system, an etching device, a heat treatment device, or a flattening device. The processing device is not specifically limited and may include various devices.

The control unit 35 illustrated in FIG. 1 is an electronic control unit including CPU (Central Processing Unit), ROM (Read Only Memory), RAM (Random Access Memory), or the like. The control unit 35 is configured or programmed to control various operations in the travel vehicle 6. Specifically, the control unit 35 controls the travel unit 50, the lateral moving unit 24, θ drive 26, the elevating drive unit 28, and the elevating platform 30. The control unit 35 may be configured as, for example, software in which program stored in ROM is loaded on RAM and is executed with CPU. The control unit 35 may be configured as hardware such as an electric circuit. The control unit 35 communicates with a controller 90 using the feed unit 40E (or feeder wire) of the traveling rail 4.

When the travel vehicle 6 travels in the first section 71 (see FIG. 2 and FIG. 3) which is a descending gradient, the control unit 35 in the present preferred embodiment controls a driver or the like to activate brakes of the regenerative brakes 53, causing the travel vehicle 6 to travel at a predetermined safe speed. When the travel vehicle 6 travels in the second section 72 (see FIG. 2 and FIG. 3) having no gradient, the control unit 35 controls a driver or the like to release brakes of the regenerative brakes 53 and controls the LDM 59 to cause the travel vehicle 6 to travel at a predetermined speed. When the travel vehicle 6 travels in the third section 75 and the fourth section 76 (see FIG. 2 and FIG. 3), the control unit 35 controls a driver or the like to release brakes of the regenerative brakes 53 and controls the LDM 59 to cause the travel vehicle 6 to travel at a predetermined speed.

The controller 90 is an electronic control unit including CPU, ROM, RAM, or the like. The controller 90 can be configured as, for example, software in which program stored in ROM is loaded on RAM and is executed with CPU. The controller 90 may be configured as hardware such as an electric circuit. The controller 90 transmits to the travel vehicle 6 a transport instruction to transport an article 10.

Actions and effects in the rail-guided vehicle system 1 of the present preferred embodiment will be described. As illustrated in FIG. 3, in the rail-guided vehicle system 1 of the present preferred embodiment, the descending rail T21 is arranged in a helical manner, so that a gradient of the descending rail T21 can be adjusted to be appropriate for the travel vehicle 6 to travel thereon and the descending rail T21 can be formed into a compact flat space. The descending rail T21 in the rail-guided vehicle system 1 of the present preferred embodiment includes not only a traveling rail 4 in the first section 71 where heat energy converted from the kinetic energy is generated when the regenerative brakes 53 works, but also a traveling rail 4 in the second section 72 where the heat energy generated in the first section 71 is released. As a result, the heat energy or the electric energy that has been generated in the first section 71 can be released or consumed in the second section 72, respectively, thus preventing defects of the regenerative brakes 53 caused by invalidation of regeneration or damage due to an excessive heat generation in the resistor 54. As a result, the regenerative brakes 53 of the traveling vehicle 6 can work properly in the descending rail T21 connecting between floors having a difference in height.

In the rail-guided vehicle system 1 of the present preferred embodiment, since the traveling rail 4 in the second section 72 extends in a horizontal direction, the second section 72 can be formed with a simplified configuration. The second section 72 is a section where heat energy that has been generated when a travel vehicle traveled in the first section 71 is released. Further, in such a horizontal section, the travel vehicle 6 can place an article 10 on the placement section 9 from various directions and also can branch or join easily.

In the rail-guided vehicle system 1 of the present preferred embodiment, since a descending gradient of the traveling rail 4 in the first section 71 is larger than a descending gradient of the traveling rail 4 in the second section 72, the second section 72 can be formed with a simplified configuration. The second section 72 is a section where heat energy that has been generated when a travel vehicle traveled in the first section 71 is released.

In the rail-guided vehicle system 1 of the present preferred embodiment, the descending rail T21 includes the traveling rails 4 which define straight sections 73 arranged so as to be parallel or substantially parallel to each other in a plan view seen from above in a vertical direction and the traveling rail 4 which defines the curved section 74 provided at ends of the traveling rails 4 defining the straight sections 73. In the rail-guided vehicle system 1 of the present preferred embodiment, the ascending rail T22 is arranged so as to overlap with the descending rail T21 in a plan view from above in a vertical direction. In the rail-guided vehicle system 1 with such a configuration, the ascending rail and the descending rail can be installed integrally in a narrow and long space between buildings.

In the rail-guided vehicle system 1 of the present preferred embodiment, the step 85 for a worker to do maintenance work is provided in an area surrounded the descending rail T21 and the ascending rail T22 arranged in a helical manner. As a result, a space can be used effectively and the maintenance work in the descending rail T21 and the ascending rail T22 can be performed easily.

One preferred embodiment has been described above, the present invention is not limited to the above-described preferred embodiment. Various changes can be made without departing from the scope of the present invention.

Modification 1

Figure 4:
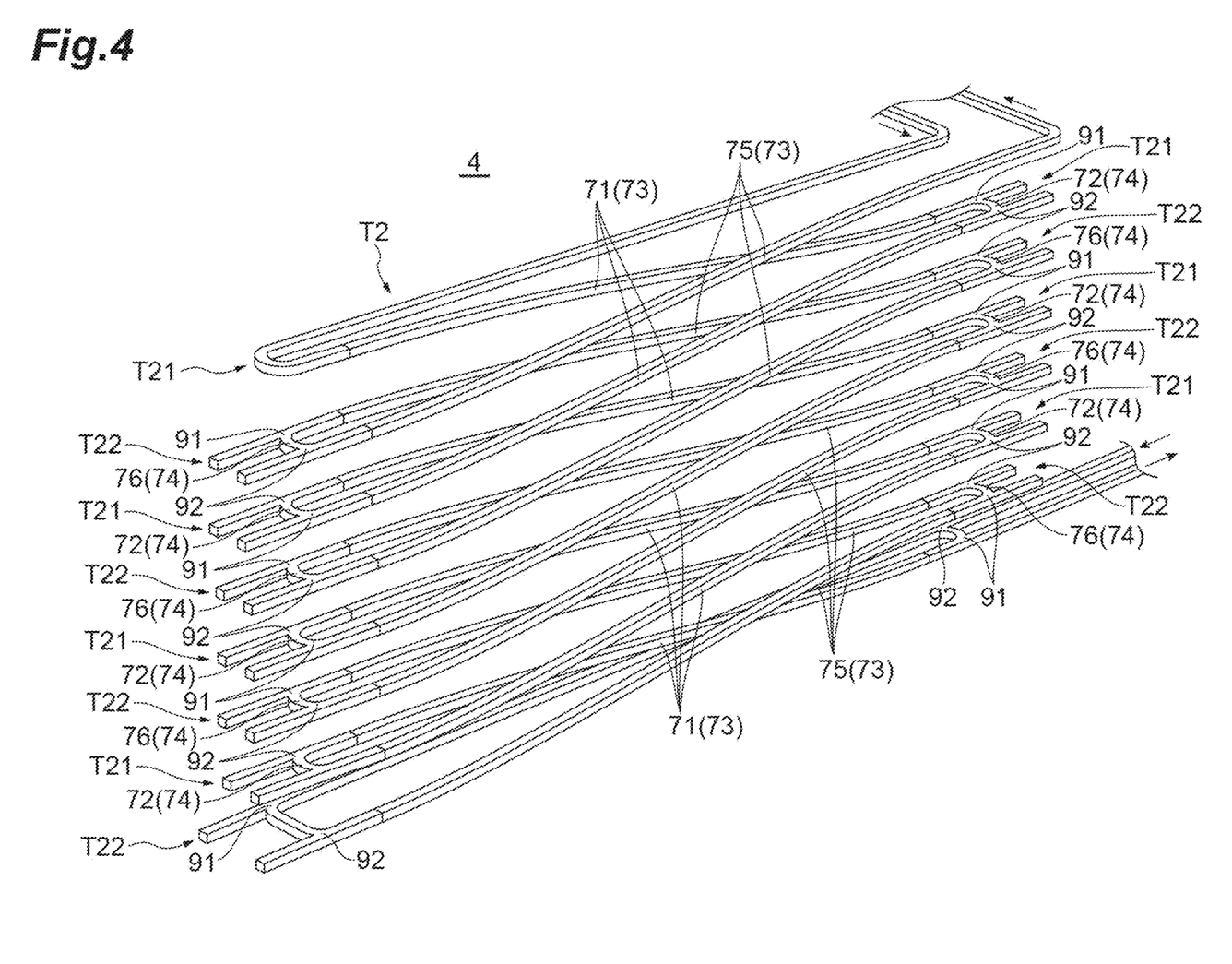
FIG. 4 is a perspective view illustrating a descending rail and an ascending rail in according to a modification 1.

For example, in the rail-guided vehicle system 1 according to a modification 1, as illustrated in FIG. 4, in addition to the configuration of the rail-guided vehicle system 1 according to the above-described preferred embodiment, branching portion 91 and joining portion 92 are provided between the bottommost position and the topmost position. When the descending rail T21 or the ascending rail T22 is regarded as a main line rail, the branching portion 91 is a portion that branches from the main line rail into a branch line rail which is a rail installed at each floor. When the descending rail T21 or the ascending rail T22 is regarded as a main line rail, the joining portion 92 is a portion that joins into the main line rail from the branch line rail. When the first building B1 includes a plurality of floors, the branching portion 91 and the joining portion 92 are provided corresponding to each floor. The branching portion 91 and the joining portion 92 are provided at the traveling rail 4 extending in a horizontal direction.

In the rail-guided vehicle system 1 according to the modification 1, a downward movement to each of the plurality of floors and an upward movement to each of the plurality of floors can be performed easily. As a result, an article 10 can be transported by the traveling vehicle 6 to a processing device installed at each floor in the first building B1.

Modification 2

In the rail-guided vehicle system 1 according to the above-described preferred embodiment and the modification 1, as illustrated in FIG. 3 and FIG. 4, it was described as an example that the descending rail T21 and the ascending rail T22 have the traveling rails 4 which define straight sections 73 arranged so as to be parallel or substantially parallel to each other in a plan view seen from above in a vertical direction and the traveling rail 4 which defines the curved section 74 provided at end portions of the traveling rails 4 defining the straight sections 73. However, the present invention is not limited thereto.

Figure 5:
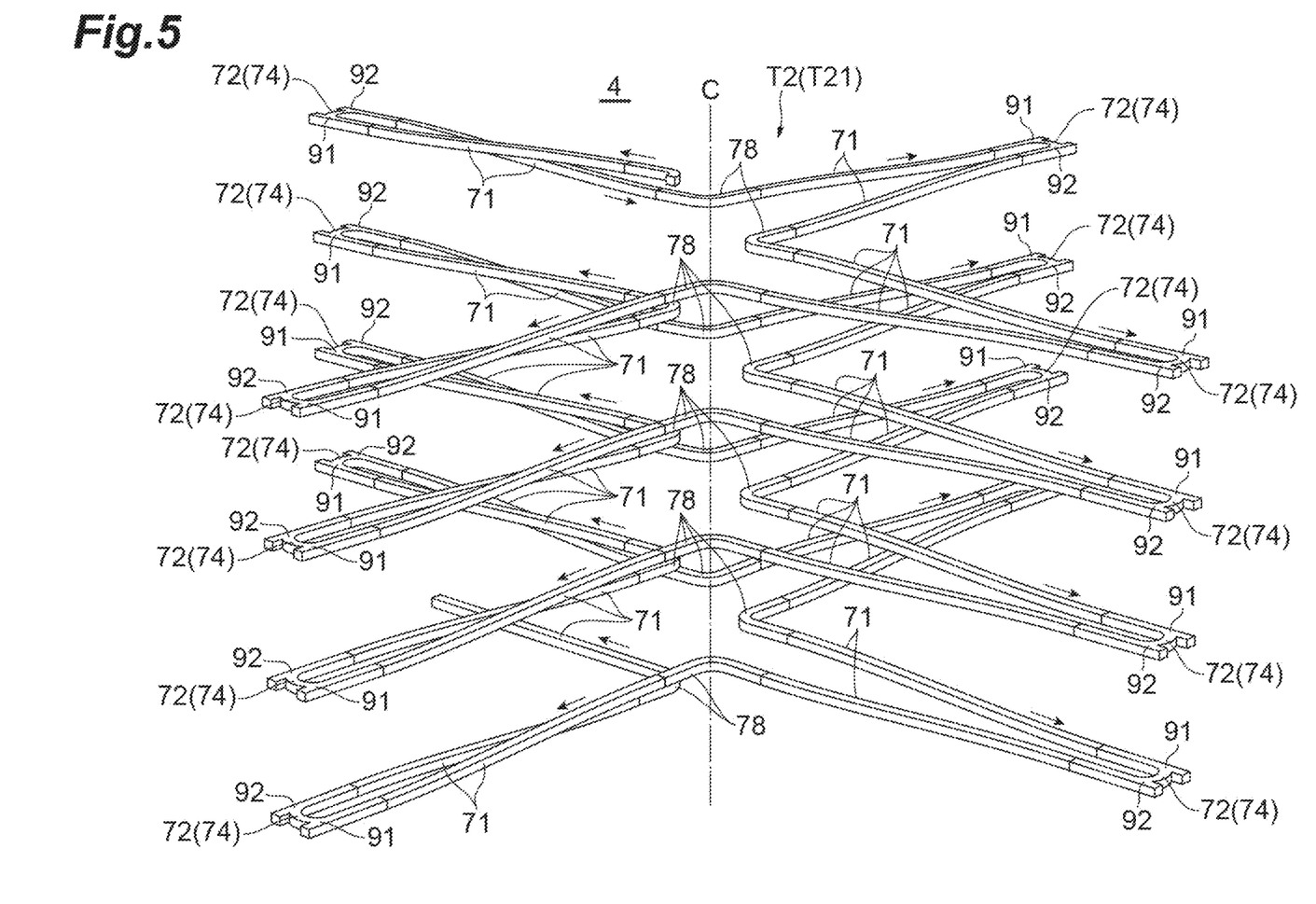
FIG. 5 is a perspective view illustrating a descending rail and an ascending rail in according to a modification 2.

The descending rail T21 of the rail-guided vehicle system 1 according to a modification 2 includes, for example, as illustrated in FIG. 5, a traveling rail 4 extending radially from a helical center C of the descending rail T21 arranged in a helical manner. Curved line rails 78 are provided at the descending rail T21 of the modification 2, so that the traveling rail 4 extends radially from the helical center C. As with the rail-guided vehicle system 1 according to the above-described preferred embodiment and the modification 1, the descending rail T21 of the rail-guided vehicle system 1 according to the modification 2 has a traveling rail 4 which defines the first section 71 where electric energy, which is generated when the regenerative brakes 53 included in the travel vehicle 6 works, is converted into heat energy in the resistor 54, and a traveling rail 4 which defines the second section 72 where the heat energy, which has been converted in the first section 71, is released from the resistor 54.

In the rail-guided vehicle system 1 according to the modification 2, the curved section 74 is provided at folded portion of the traveling rail 4 extending radially. The curved section 74 is defined by the traveling rail 4 extending in a horizontal direction. As with the modification 1, the branching portion 91 and the joining portion 92 are provided at the curved section 74.

In the rail-guided vehicle system 1 according to the modification 2, a downward movement to the plurality of floors and an upward movement to the plurality of floors can be performed easily. As a result, an article 10 can be transported by the traveling vehicle 6 to a processing device installed at each floor in the first building B1. In addition, with this configuration, the vertical spacing between the descending rails T21 can be increased by easily adjusting length of the traveling rail 4.

Modification 3

Figure 6:
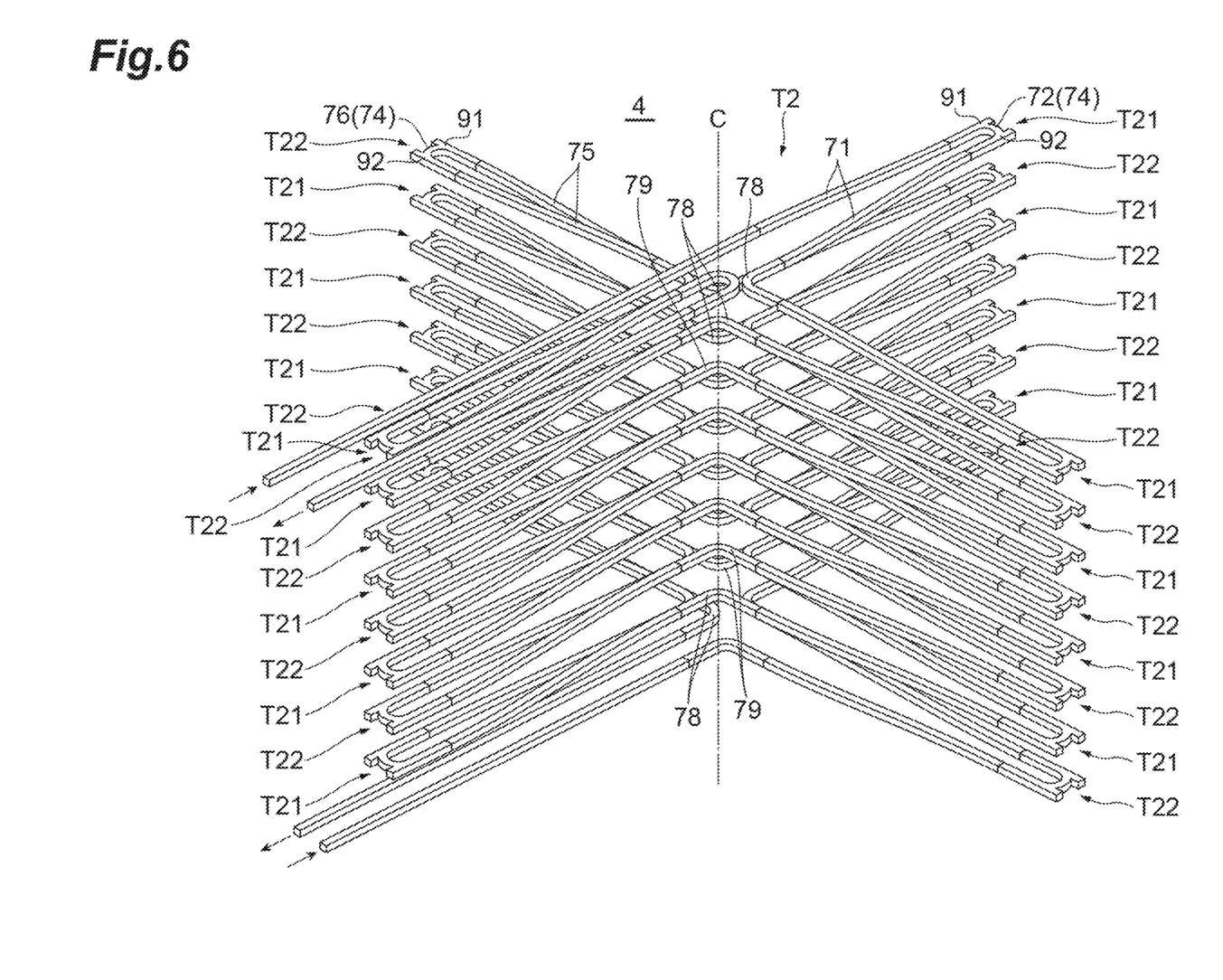
FIG. 6 is a perspective view illustrating a descending rail and an ascending rail in according to a modification 3.

In the rail-guided vehicle system 1 according to a modification 3, as illustrated in FIG. 6, in addition to the descending rail T21 according to the modification 2, the ascending rail T22 is provided. The ascending rail T22 is arranged so as to overlap with the descending rail T21 in a plan view seen from above in a vertical direction. Also in the rail-guided vehicle system 1 according to the modification 3, the same effect as that of the rail-guided vehicle system 1 according to the modification 2 can be obtained.

Another Modification

It was described as an example that electric energy generated when the regenerative brakes 53 work is converted into heat energy in the resistor 54 included in the travel vehicle 6 used for the rail-guided vehicle system 1 according to the above-described preferred embodiment and the modifications. However, the travel vehicle 6 may be provided with a battery 54A instead of the resistor 54. The travel vehicle 6 including the battery 54A can cause electric energy generated when the regenerative brakes 53 work to be stored in the battery 54A.

In the rail-guided vehicle system 1 including a travel vehicle 6 with such a configuration, electric energy generated when the regenerative brakes 53 work, is stored into the battery 54A in the first section 71 of the descending rail T21, and the electric energy that has been stored in the first section 71, is consumed from the battery 54A in the second section 72. In the present preferred embodiment, the electric energy is used to generate magnetic force in the LDM59. The magnetic force is for causing the travel vehicle 6 to travel between the LDM59 and the magnetic plate F arranged on top surface of the traveling rail 4. With such a configuration, defects of the regenerative brakes 53 caused by invalidation of regeneration or decrease in longevity of the battery 54A due to overcharge into the battery 54A can be prevented. As a result, the regenerative brakes 53 of the travel vehicle 6 can work properly in the descending rail T21 connecting between floors having a difference in height.

In the above modification, it was described that the battery 54A is provided at each travel vehicle 6. For example, a battery may be installed at least at one position along the descending rail T21, and electric energy that has been generated at each travel vehicle 6 may be transferred through the traveling rail 4 or a conductive member arranged along an extending direction of the traveling rail 4. With such a configuration, the travel vehicle 6 uses electric energy stored in a battery provided along the descending rail 21 when traveling in the second section 72, so that the same effect as that of the above modification can be obtained.

In the above-described preferred embodiment and the modifications, it was described as an example that the regenerative brakes 53 of power conversion system are used for the brakes of the travel vehicle 6. For example, brakes for heat conversion system may be used. In this case, heat generated in the first section 71 is released in the second section 72 by the brakes for heat conversion system, so that the same effect as that of the above-described preferred embodiment and the modifications can be obtained.

The number of floors of the first building B1 and the direction when the traveling rail 4 extends radially illustrated in the above-described preferred embodiment and the modifications are not limited thereto and can be set properly.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A rail-guided vehicle system configured to connect between vertically-spaced floors, the rail-guided vehicle system comprising:
    a descending rail to enable a travel vehicle to move downward; and
    an ascending rail to connect between the vertically-spaced floors and to enable the travel vehicle to move upward; wherein
    the descending rail includes a helical structure, a first rail of a first section where heat energy or electric energy converted from kinetic energy by actuation of brakes included in the travel vehicle is generated, and a second rail of a second section where the heat energy generated in the first section is released or where the electric energy generated in the first section is consumed;
    the travel vehicle is an overhead hoist transport including a traveler to travel on the descending rail and the ascending rail, and a body connected to the traveler in a suspended state;
    the ascending rail overlaps with the descending rail in a plan view as seen from above in a vertical direction; and
    the second section includes:
        a branching portion that is connected to a rail suspended from a ceiling at each of the vertically-spaced floors; and
        a joining portion that connects together the rails suspended from the ceiling at each of the vertically-spaced floors.

2. The rail-guided vehicle system according to claim 1, wherein
    the travel vehicle includes regenerative brakes, and a battery to store the electric energy generated in the regenerative brakes or a resistor to convert the electric energy generated in the regenerative brakes in the heat energy;
    in the first section, the electric energy is converted into the heat energy in the resistor or the electric energy is stored in the battery; and in the second section, the heat energy converted in the resistor is released or the electric energy stored in the battery is consumed.

3. The rail-guided vehicle system according to claim 2, wherein the second rail extends in a horizontal direction.

4. The rail-guided vehicle system according to claim 3, wherein a descending gradient of the first rail is steeper than a descending gradient of the second rail.

5. The rail-guided vehicle system according to claim 2, wherein a descending gradient of the first rail is steeper than a descending gradient of the second rail.

6. The rail-guided vehicle system according to claim 1, wherein the second rail extends in a horizontal direction.

7. The rail-guided vehicle system according to claim 6, wherein a descending gradient of the first rail is steeper than a descending gradient of the second rail.

8. The rail-guided vehicle system according to claim 1, wherein a descending gradient of the first rail is steeper than a descending gradient of the second rail.

9. The rail-guided vehicle system according to claim 1, wherein the descending rail includes rails defining straight sections parallel or substantially parallel to each other in the plan view as seen from above in the vertical direction and a rail defining a curved section at end portions of the rails defining the straight sections.

10. The rail-guided vehicle system according to claim 1, wherein the descending rail and the ascending rail include a helical section extending radially from a center of the descending rail and the ascending rail.

11. The rail-guided vehicle system according to claim 1, wherein a step for a worker to do maintenance work is provided in an area surrounded by the descending rail.

12. The rail-guided vehicle system according to claim 1, wherein
the ascending rail includes:
a branching portion that is connected to a rail suspended from the ceiling at each of the vertically-spaced floors; and
a joining portion that connects together the rails suspended from the ceiling at each of the vertically-spaced floors.

* * * * *